US008598622B2

(12) United States Patent
Sadamatsu et al.

(10) Patent No.: US 8,598,622 B2
(45) Date of Patent: Dec. 3, 2013

(54) SEMICONDUCTOR DEVICE

(75) Inventors: Koji Sadamatsu, Tokyo (JP); Ze Chen, Tokyo (JP); Katsumi Nakamura, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 139 days.

(21) Appl. No.: 13/324,306

(22) Filed: Dec. 13, 2011

(65) Prior Publication Data

US 2012/0273836 A1    Nov. 1, 2012

(30) Foreign Application Priority Data

Apr. 26, 2011 (JP) ................................. 2011-098360

(51) Int. Cl.
*H01L 29/74* (2006.01)
*H01L 31/111* (2006.01)

(52) U.S. Cl.
USPC .................... 257/139; 257/409; 257/E29.197

(58) Field of Classification Search
USPC .......... 257/135, 138, 139, 197, 409, E29.027, 257/E29.066, E29.197
See application file for complete search history.

(56) References Cited

U.S. PATENT DOCUMENTS

2011/0006338 A1* 1/2011 Senoo ........................... 257/139

FOREIGN PATENT DOCUMENTS

| JP | 6-21358 | 1/1994 |
| JP | 2006-196775 | 7/2006 |
| JP | 2007-129195 | 5/2007 |
| JP | 2009-99713 | 5/2009 |
| JP | 2009-176772 | 8/2009 |

* cited by examiner

*Primary Examiner* — Hoai V Pham
(74) *Attorney, Agent, or Firm* — Oblon, Spivak, McClelland, Maier & Neustadt, L.L.P.

(57) ABSTRACT

A semiconductor device includes: a transistor region including an IGBT having a gate electrode and an emitter electrode; a termination region placed around the transistor region; and an extraction region placed between the transistor and the termination region and extracting redundant carriers. A P-type layer is placed on an N-type drift layer in the extraction region. The P-type layer is connected to the emitter electrode. A dummy gate electrode is placed via an insulation film on the P-type layer. The dummy gate electrode is connected to the gate electrode. Life time of carriers in the termination region is shorter than life time of carriers in the transistor region and the extraction region.

3 Claims, 12 Drawing Sheets

SEMICONDUCTOR DEVICE

BACKGROUND OF THE INVENTION

1. Field of the Invention

The present invention relates to a semiconductor device having an IGBT (Insulated Gate Bipolar Transistor).

2. Background Art

A semiconductor device having an IGBT is used as a power device of high withstand voltage (600 V or higher). As such a semiconductor device, there has been proposed a semiconductor device wherein an extraction region is placed between a transistor region having the IGBT and a termination region placed around the transistor region (for example, refer to the p-layer 4' in FIG. 1 of Japanese Patent Application Laid-Open No. 6-21358). By the configuration of the extraction region, redundant carriers (holes) can be extracted during turn-off operation.

In the semiconductor device according to Japanese Patent Application Laid-Open No. 6-21358, lattice defect is introduced into the termination region and the extraction region. Since the carrier concentration during turn-off operation can be lowered thereby, depletion can be easily made, and field intensity can be reduced. Therefore, the current breaking capability during turn-off operation can be improved. The term of current breaking capability used here means the maximum breakable current density without the breakdown of the semiconductor device during turn-off operation.

SUMMARY OF THE INVENTION

The extraction region is included in an active region wherein the major current flows when the IGBT is ON. Therefore, when lattice defect is introduced in the extraction region, there is a problem of the elevation of ON voltage (ON resistance).

To solve the problem as described above, it is an object of the present invention to obtain a semiconductor device that can lower ON voltage while improving a current breaking capability during turn-off operations.

According to the present invention, a semiconductor device comprises: a transistor region including an IGBT having a gate electrode and an emitter electrode; a termination region placed around the transistor region; an extraction region placed between the transistor and the termination region and extracting redundant carriers, wherein a P-type layer is placed on an N-type drift layer in the extraction region, the P-type layer is connected to the emitter electrode, a dummy gate electrode is placed via an insulation film on the P-type layer, the dummy gate electrode is connected to the gate electrode, life time of carriers in the termination region is shorter than life time of carriers in the transistor region and the extraction region.

The present invention makes it possible to lower ON voltage while improving a current breaking capability during turn-off operations.

Other and further objects, features and advantages of the invention will appear more fully from the following description.

DETAILED DESCRIPTION OF THE PREFERRED EMBODIMENTS

A semiconductor device according to the embodiments of the present invention will be described with reference to the drawings. The same components will be denoted by the same symbols, and the repeated description thereof may be omitted.

First Embodiment

Figure 1:
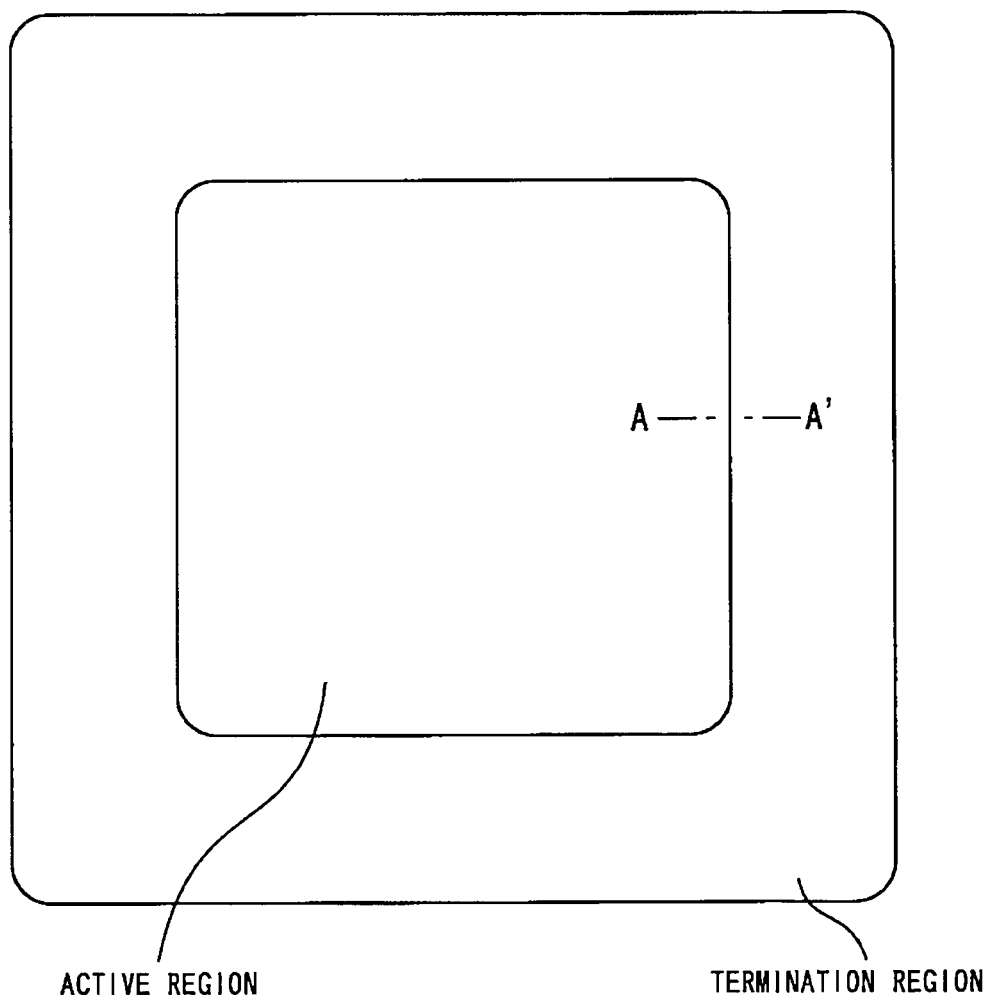
FIG. 1 is a top view showing a semiconductor device according to the first embodiment of the present invention.

FIG. 1 is a top view showing a semiconductor device according to the first embodiment of the present invention. The semiconductor device is a power device of high withstand voltage (600 V or higher) having an IGBT. A termination region is placed around an active region. If a voltage is applied between a collector and an emitter when the IGBT is turned off, a depletion layer extends laterally in the termination region. Therefore, by forming the termination region, withstand voltage can be maintained. In addition, when the IGBT is ON, although a principal current flows in the active region, no principal current flows in the termination region.

Figure 2:
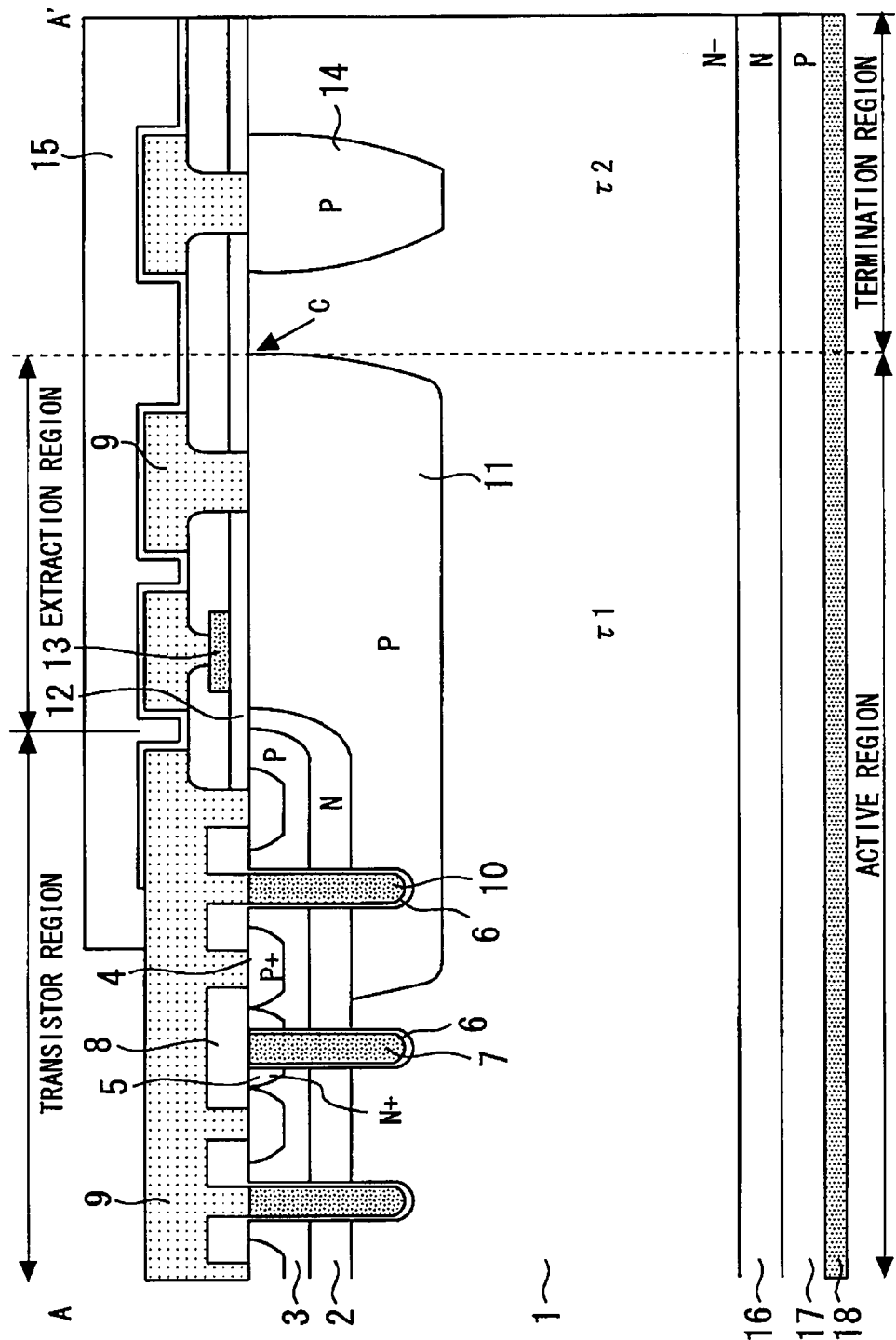
FIG. 2 is a sectional view taken along the line A-A' in FIG. 1.

FIG. 2 is a sectional view taken along the line A-A' in FIG. 1. The active region includes a transistor region having a plurality of trench-gate-type IGBT structure, and an extraction region placed between the transistor region and the termination region.

In the transistor region, an N-type charge accumulation layer 2 is formed on an N⁻-type drift layer 1, and a P-type base layer 3 is formed thereon. On a part of the P-type base layer 3, a P⁺-type contact layer 4 and an N⁺-type emitter layer 5 are formed. A trench is formed so as to penetrate the N⁺-type emitter layer 5, the P-type base layer 3, and the N-type charge accumulation layer 2, and a gate electrode 7 is formed therein via a gate insulation film 6. An interlayer insulation film 8 is formed on the gate electrode 7. On the entire surface of the transistor region, an emitter electrode 9 is formed, and is connected to a P⁺-type contact layer 4.

A dummy trench is formed so as to penetrate P-type base layer 3 and the N-type charge accumulation layer 2, and a dummy gate electrode 10 is formed therein via the gate insulation film 6. The dummy gate electrode 10 is connected to the emitter electrode 9. By such a configuration, the effect such as the inhibition of oscillation in short circuiting can be obtained.

In the extraction region, a P-type layer 11 is formed on the N⁻-type drift layer 1. The P-type layer 11 is connected to the emitter electrode 9. On the P-type layer 11, a dummy gate electrode 13 is formed via an insulation film 12. The dummy gate electrode 13 is connected to the gate electrode 7. This configuration does not operate as a MOS transistor, and extracts redundant carriers (holes) during the turn-off operation. The boundary between the active region and the termination region is positioned on the outer end of the P-type layer 11.

In the termination region, a P-type layer 14 is formed on a part of the N⁻-type drift layer 1. The P-type layer 14 is a guard ring for high withstand voltage. In a part of the transistor region, the extraction region, and the termination region, a surface protection film 15 coats the emitter electrode 9.

In the active region and the termination region, an N-type buffer layer 16 is formed under the N⁻-type drift layer 1, and a P-type collector layer 17 is formed thereunder. A collector electrode 18 is connected to the P-type collector layer 17.

In the present embodiment, the active region is coated with a stainless-steal mask, so that the termination region is selectively irradiated by particle beams (for example, electron beams). Therefore, the density of lattice defect in the termination region is higher than the density of lattice defect in the transistor region and the extraction region. As a result, the life time τ2 of carriers in the termination region is shorter than the life time τ1 of carriers in the transistor region and the extraction region.

Next, the effect of the first embodiment will be described in comparison with a comparative example. Although the comparative example is different from the first embodiment in that the introduction of lattice defect by irradiation is not conducted, other configurations are identical to those of the first embodiment.

Figure 3:
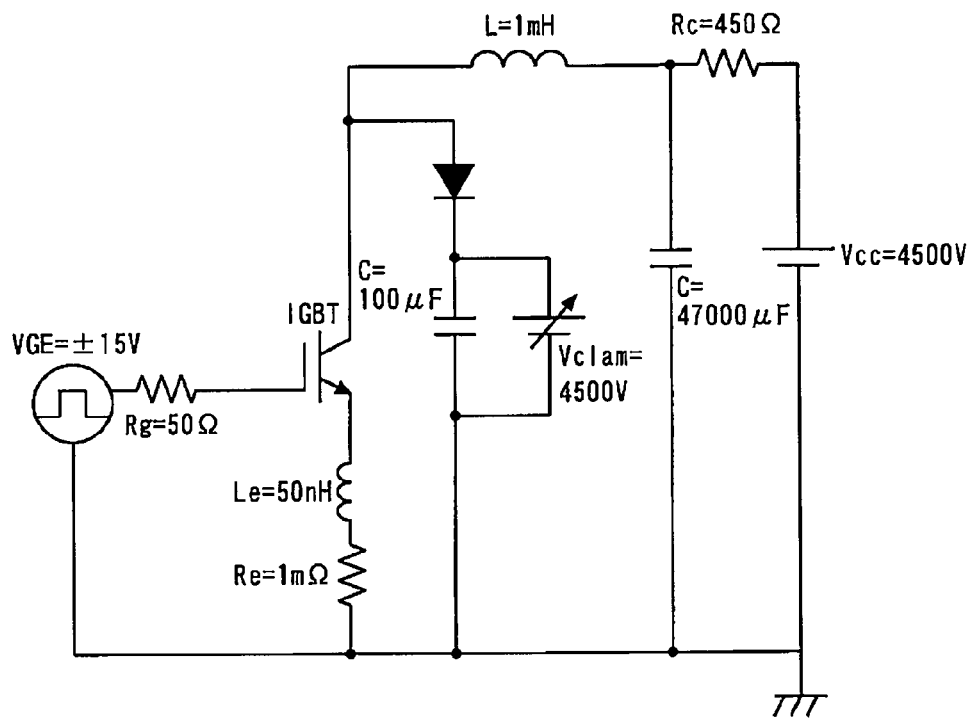
FIG. 3 is a diagram showing an evaluative circuit when the L-load turn-off characteristics of the IGBT were simulated.
Figure 4:
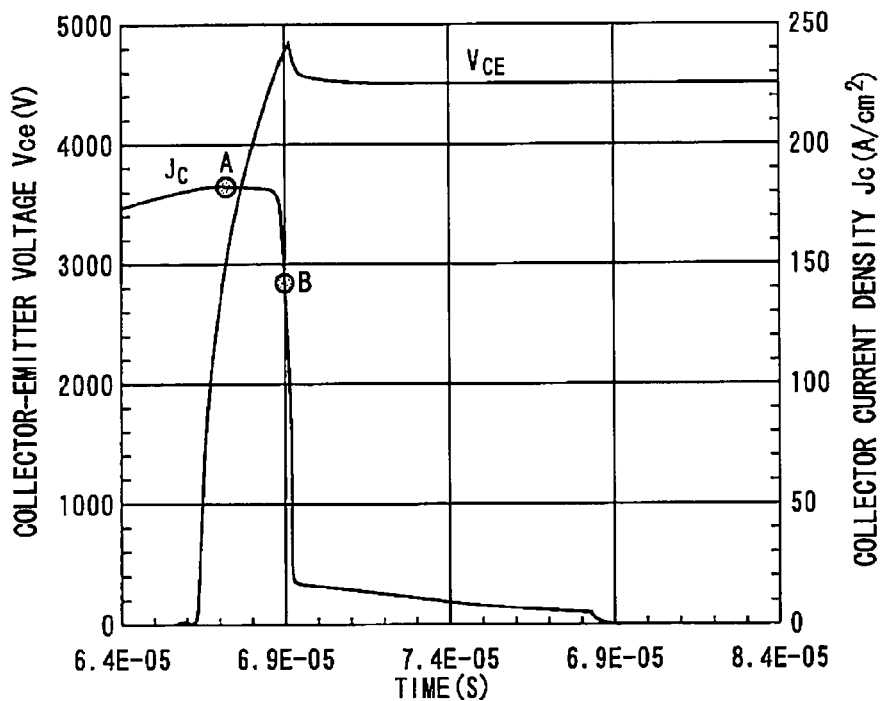
FIG. 4 is a graph showing a turn-off waveform of a typical IGBT simulated using the circuit shown in FIG. 3.

FIG. 3 is a diagram showing an evaluative circuit when the L-load turn-off characteristics of the IGBT were simulated. The source voltage Vcc is 4500 V, the collector current density $J_C$ is 180 A/cm², the gate voltage $V_G$ is ±15 V, and the temperature is 398 K. The withstand voltage of the IGBT is 6500 V, the impurity concentration of the N⁻-type drift layer is $6.5×10^{12}$ cm⁻³, and the thickness of the N⁻-type drift layer is 650 μm. FIG. 4 is a graph showing a turn-off waveform of a typical IGBT simulated using the circuit shown in FIG. 3. The point A shows the time point when the collector current density $J_C$ blocked by the IGBT becomes largest, and the point B shows the time point when the internal temperature of the IGBT becomes highest.

Figure 5:
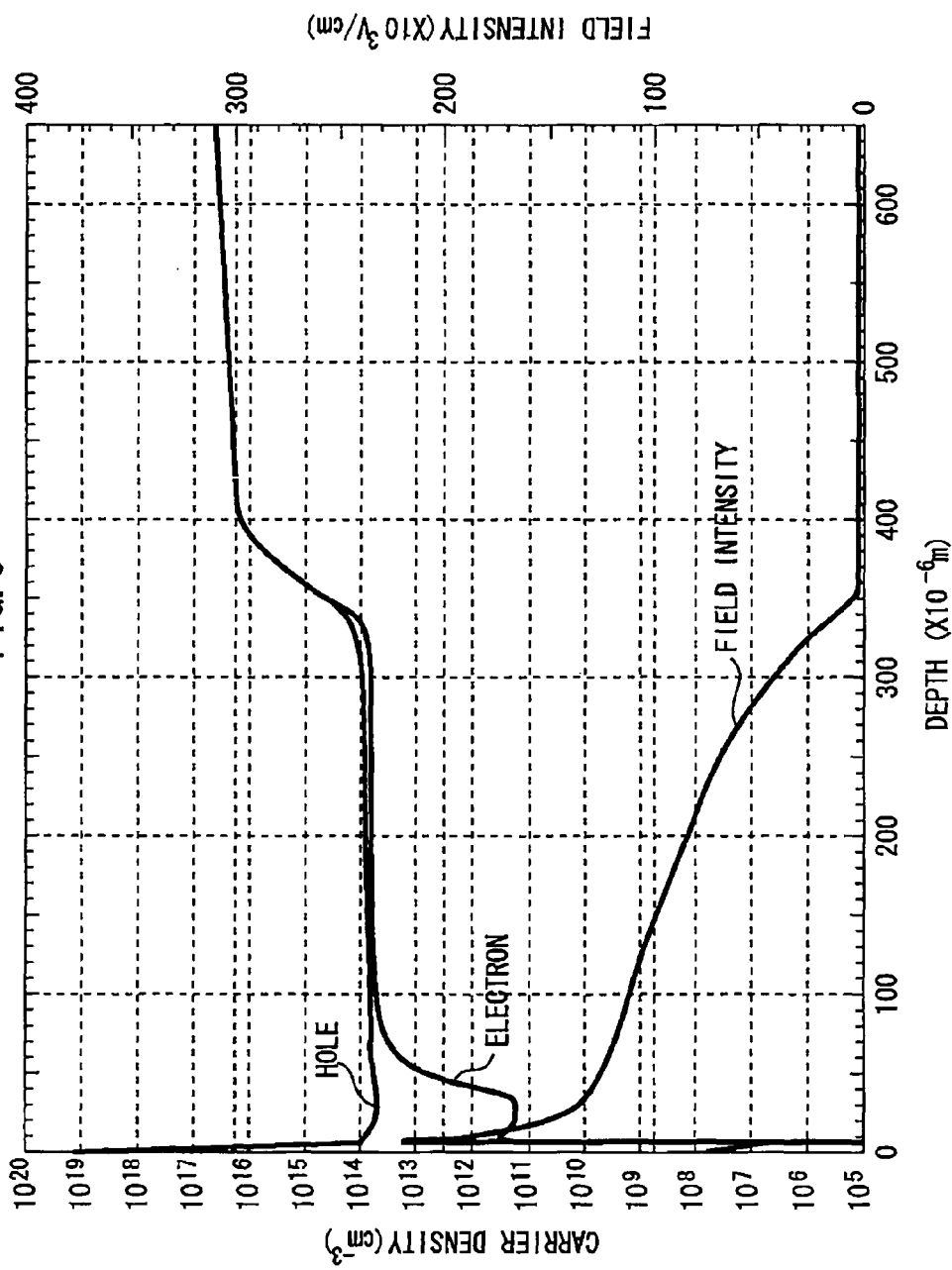
FIG. 5 is a graph showing the depth direction distribution of the carrier concentration and the field intensity distribution along the boundary between the termination region and the active region of the comparative example at the point A in FIG. 4.
Figure 6:
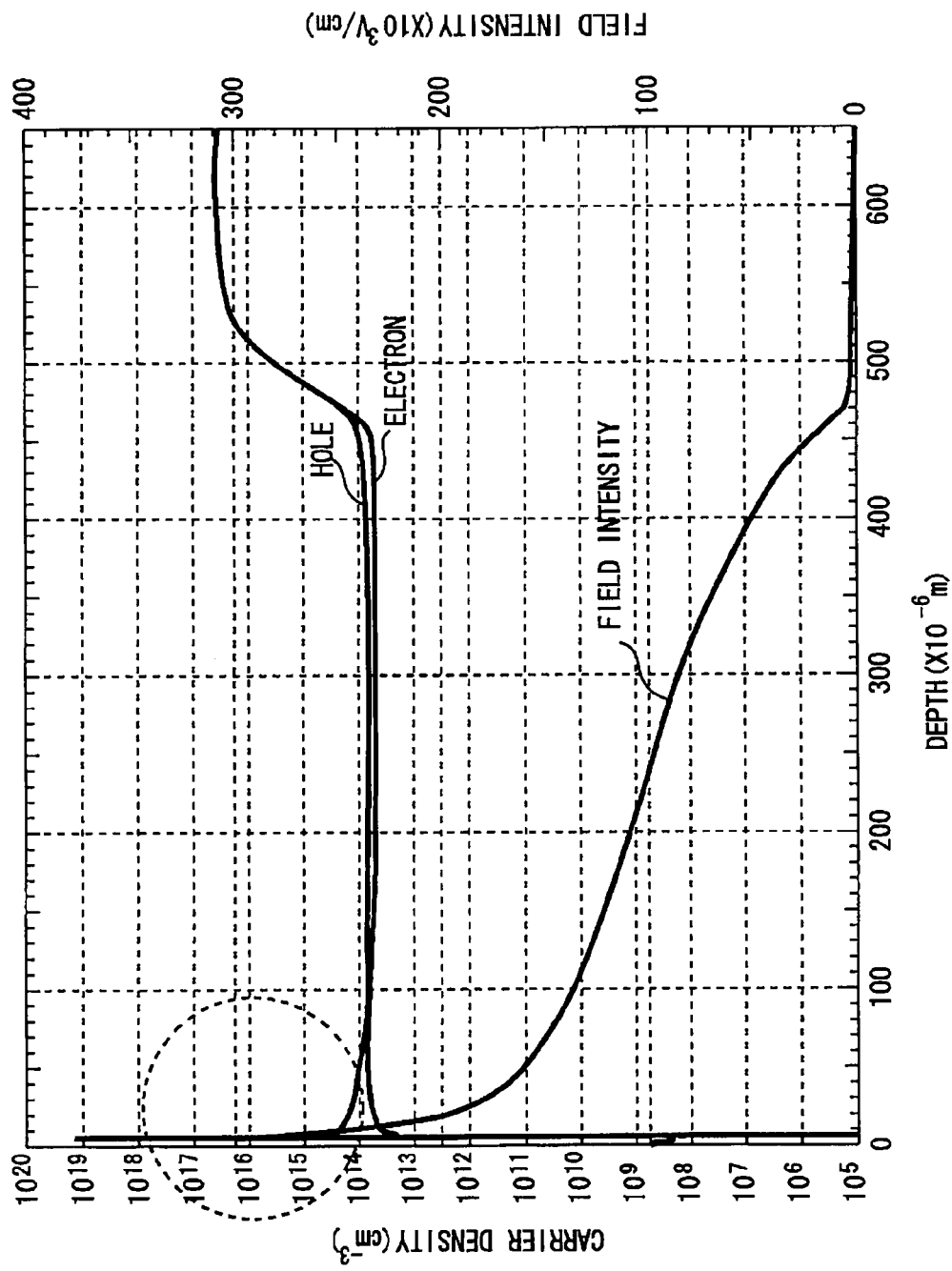
FIG. 6 is a graph showing the depth direction distribution of the carrier concentration and the field intensity distribution along the boundary between the termination region and the active region of the comparative example at the point B in FIG. 4.

FIG. 5 is a graph showing the depth direction distribution of the carrier concentration and the field intensity distribution along the boundary between the termination region and the active region of the comparative example at the point A in FIG. 4. FIG. 6 is a graph showing the depth direction distribution of the carrier concentration and the field intensity distribution along the boundary between the termination region and the active region of the comparative example at the point B in FIG. 4. In the comparative example, since the carrier concentration is elevated from the depth of about 400 μm during the turn-off operation of the IGBT, depletion in the collector direction is slow. Therefore, at the point B, the field intensity in the emitter side becomes $3×10^5$ V/cm or higher, impact ionization is promoted. As a result, the current density is elevated at the point C in FIG. 2, resulting in thermal destruction.

Figure 7:
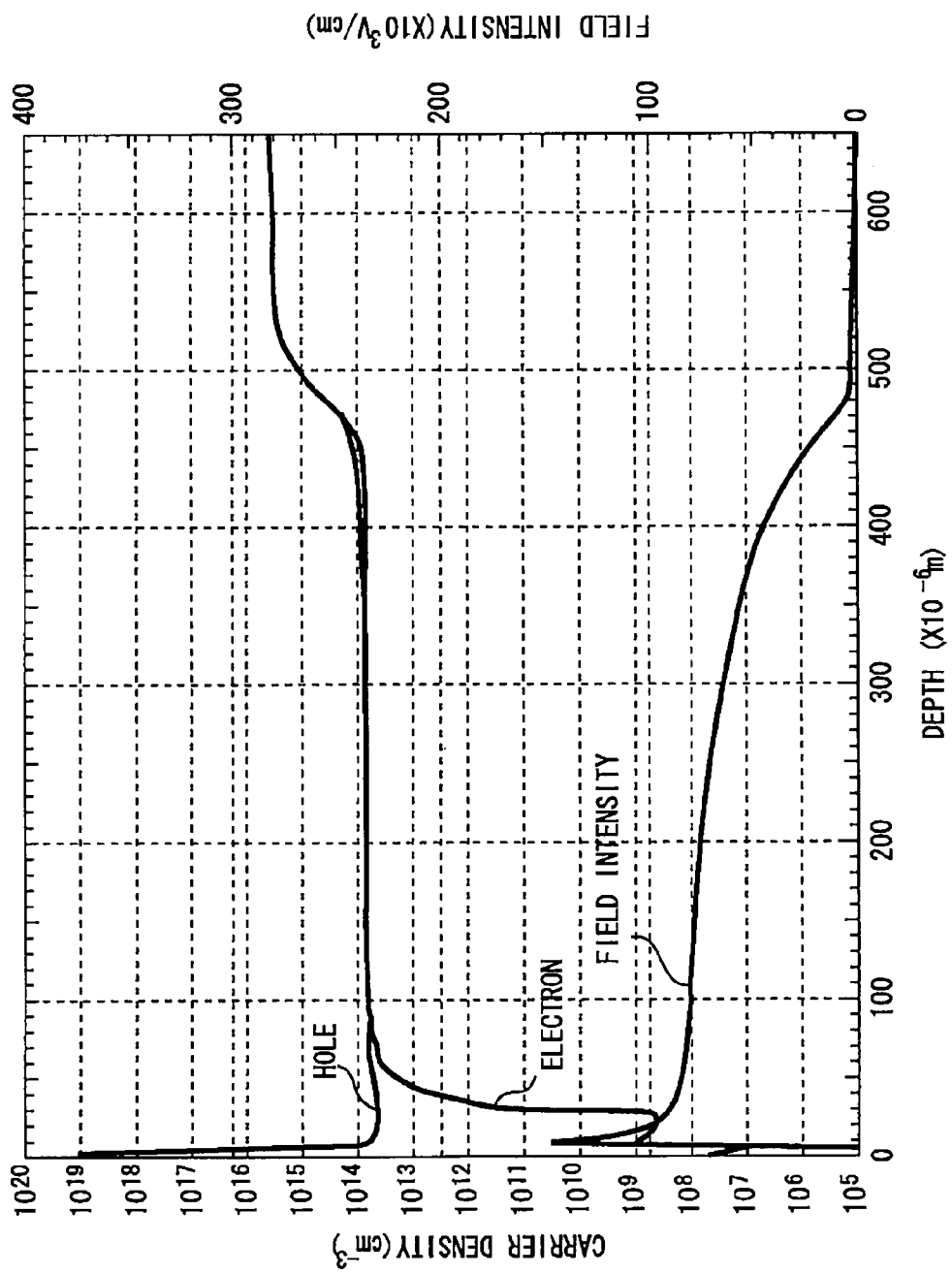
FIG. 7 is a graph showing the depth direction distribution of the carrier concentration and the field intensity distribution along the boundary between the termination region and the active region of the first embodiment at the point A in FIG. 4.
Figure 8:
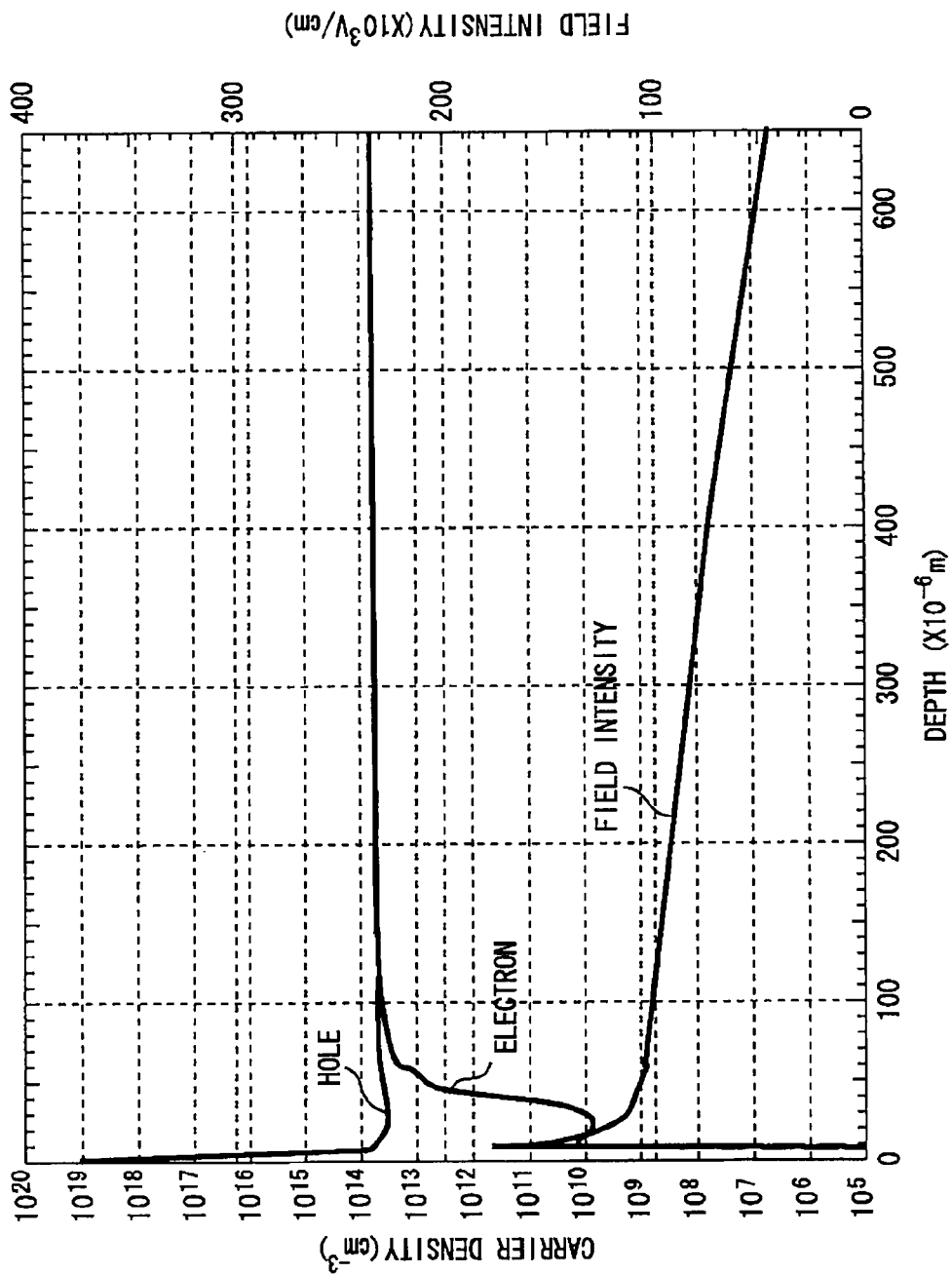
FIG. 8 is a graph showing the depth direction distribution of the carrier concentration and the field intensity distribution along the boundary between the termination region and the active region of the first embodiment at the point B in FIG. 4.

FIG. 7 is a graph showing the depth direction distribution of the carrier concentration and the field intensity distribution along the boundary between the termination region and the active region of the first embodiment at the point A in FIG. 4. FIG. 8 is a graph showing the depth direction distribution of the carrier concentration and the field intensity distribution along the boundary between the termination region and the active region of the first embodiment at the point B in FIG. 4. In the first embodiment, since the carrier concentration is elevated from the depth of about 500 μm during the turn-off operation of the IGBT, depletion in the collector direction is quick. Therefore, at the point B, the field intensity in the emitter side is lowered, impact ionization is suppressed. As a result, the elevation of current density and the thermal destruction at the point C in FIG. 2 are suppressed.

In the case of the comparative example, as described above, the carrier concentration in the emitter side is not lowered during the turn-off operation, and the field intensity is elevated. Then, the carrier concentration in the emitter side is elevated by the acceleration of impact ionization. As a result, since the temperature is locally elevated to cause thermal destruction, the current breaking capability is lowered.

On the other hand, in the first embodiment, since carriers existing in the termination region are easily disappeared by introducing lattice defect into the termination region, the carrier concentration in the extraction region is lowered during the turn-off operation of the IGBT. Therefore, depletion from the P-type layer 11 to the collector side is accelerated, and the field intensity is lowered. As a result, the current breaking capability during the turn-off operation of the IGBT can be improved.

Figure 9:
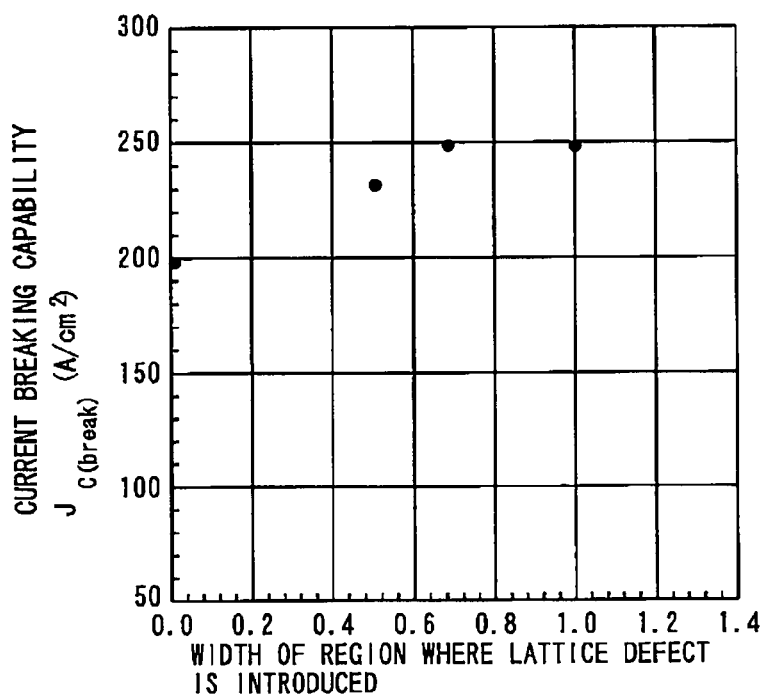
FIG. 9 is a graph showing the relationship between the width of the region where lattice defect is introduced and the current breaking capability Jc (break).
Figure 10:
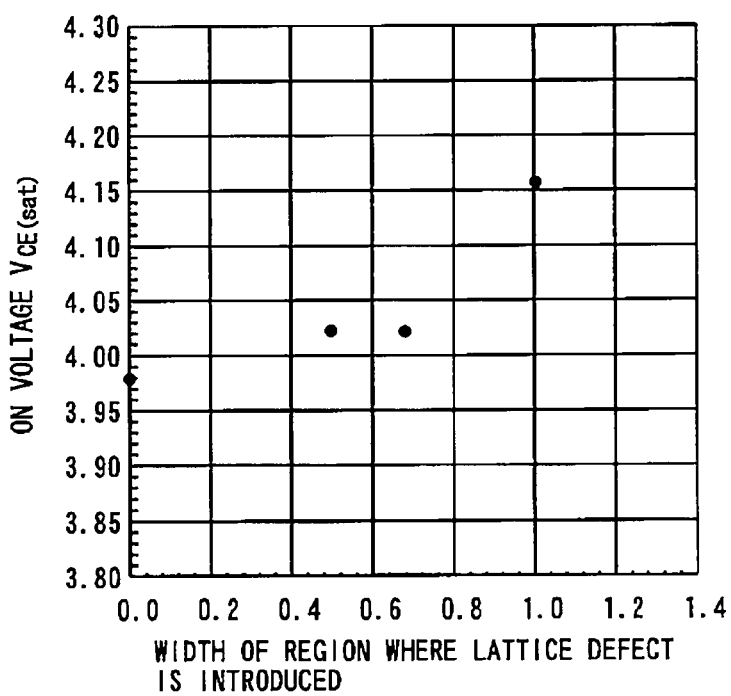
FIG. 10 is a graph showing the relationship between the width of the region where lattice defect is introduced and the ON voltage VCE (sat).
Figure 11:
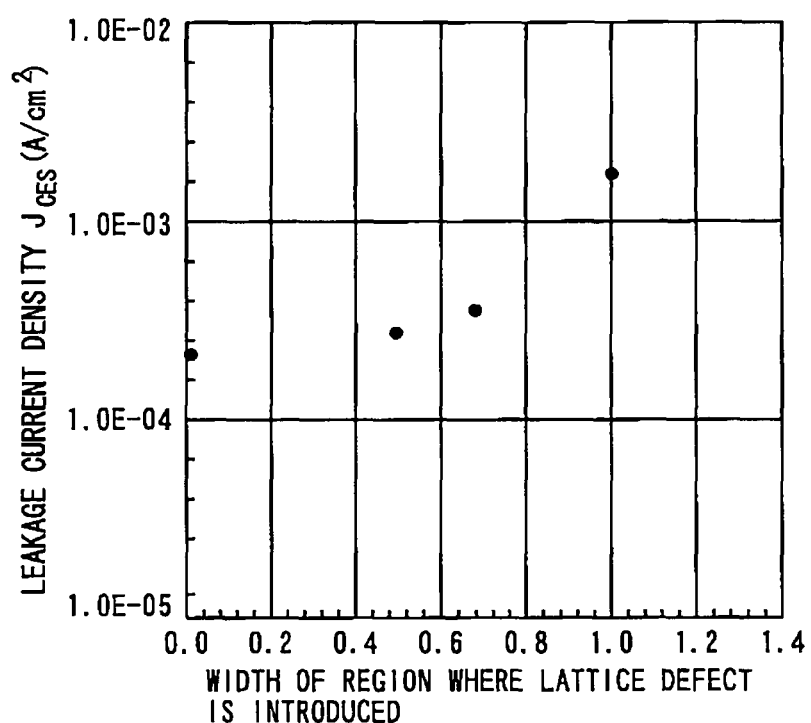
FIG. 11 is a graph showing the relationship between the width of the region where lattice defect is introduced and the leakage current density JCES.

FIG. 9 is a graph showing the relationship between the width of the region where lattice defect is introduced and the current breaking capability $J_{C\,(break)}$. The source voltage $V_{CC}$ is 3400 V. FIG. 10 is a graph showing the relationship between the width of the region where lattice defect is introduced and the ON voltage $V_{CE\,(sat)}$. The collector current density $J_C$ is 56 A/cm². FIG. 11 is a graph showing the relationship between the width of the region where lattice defect is introduced and the leakage current density $J_{CES}$. The voltage between the collector and the emitter $V_{CES}$ is 4500 V. In FIGS. 9 to 11, the temperature is 398 K.

In the abscissae of FIGS. 9 to 11, "width of the region where lattice defect is introduced" is standardized: 0 when lattice defect is not introduced (comparative example); 0.5 when lattice defect is introduced into a part of the termination region; 0.68 when lattice defect is introduced into the termination region (the first embodiment); and 1.0 when lattice defect is introduced into the termination region and the extraction region.

As shown in FIG. 9, when lattice defect is introduced, the current breaking capability is improved in comparison with the case when lattice defect is not introduced. Also as shown in FIG. 10, when lattice defect is introduced not only into the termination region but also into the extraction region, the ON voltage is elevated. In addition, as the voltage between the emitter and the collector is higher when the IGBT is off, the depletion layer extends from the P-type layer 11 to the collector side. At this time, if lattice defect is present in the extraction region, the leakage current is more easily generated as shown in FIG. 11. If the temperature becomes higher than 398 K, the leakage current density is elevated rapidly, and device breakdown is induced by thermal runaway.

In the present embodiment, lattice defect is introduced only in the termination region, and is not introduced in the extraction region. Therefore, while elevating the current breaking capability during turn-off operation, the ON voltage (ON resistance) can be lowered, and leakage current in the OFF time can also be reduced.

The joint between the P-type layer 11 and the N⁻-type drift layer 1 is near to the emitter side. Therefore, since the density of lattice defect in the termination region close to the joint can be elevated by irradiating particle beams from the emitter side, the further effect can be obtained.

Second Embodiment

Figure 12:
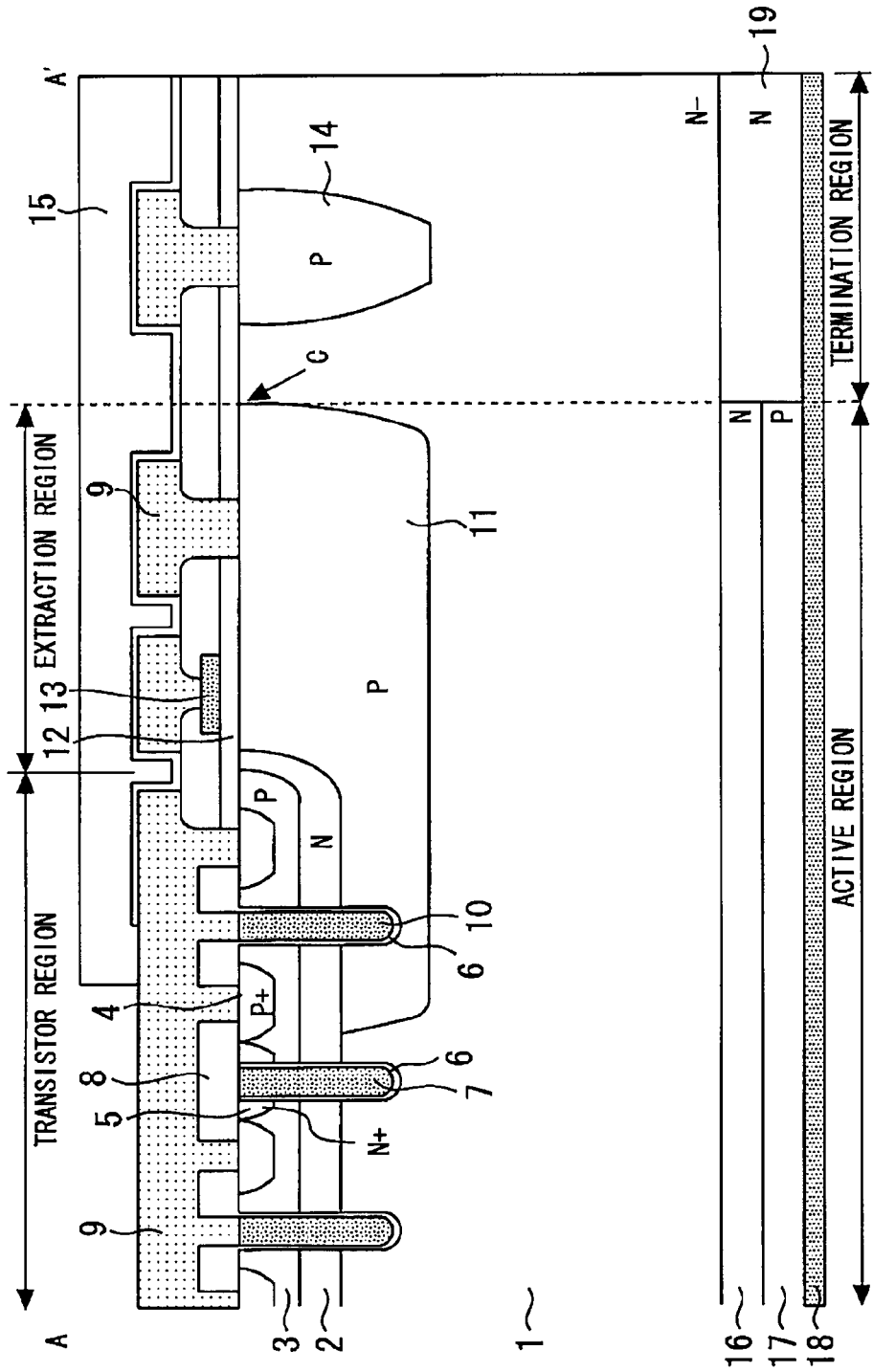
FIG. 12 is a sectional view showing a semiconductor device according to the second embodiment of the present invention.

FIG. 12 is a sectional view showing a semiconductor device according to the second embodiment of the present invention. In the transistor region and the extraction region, an N-type buffer layer 16 is formed under an N⁻-type drift layer 1, and a P-type collector layer 17 is formed thereunder. In the termination region, an N-type buffer layer 19 is formed under the N⁻-type drift layer 1. A collector electrode 18 is directly connected to the P-type collector layer 17 and the N-type buffer layer 19. In other words, the N-type buffer layer 19 in the termination region is directly contacted (short-circuited) to the collector electrode 18.

Next, the effect of the second embodiment will be described comparing to a comparative example. In the comparative example, the P-type collector layer 17 is formed also in the termination region, and the N-type buffer layer 19 is not directly contacted to the collector electrode 18.

Figure 13:
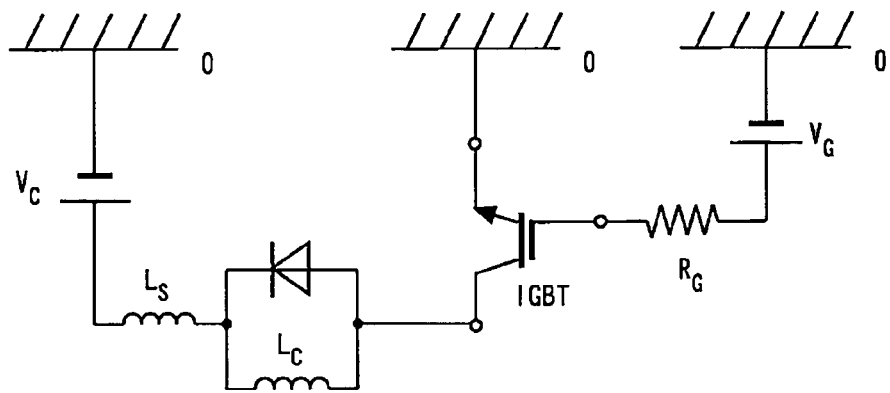
FIG. 13 is a diagram showing an evaluative circuit when the L-load turn-off characteristics of the comparative example and the device of the second embodiment are simulated.

FIG. 13 is a diagram showing an evaluative circuit when the L-load turn-off characteristics of the comparative example and the device of the second embodiment are simulated. The source voltage Vcc is 3400 V, the inductance Ls is 2.47 μH, the resistance $R_G$ is 1066Ω, and the temperature is 150° C. The withstand voltage of the IGBT is 6500 V. The evaluation was performed by elevating collector current density Jc 56 A/cm² to 1.5 times, 2.0 times, and so on until the device is broken.

Figure 14:
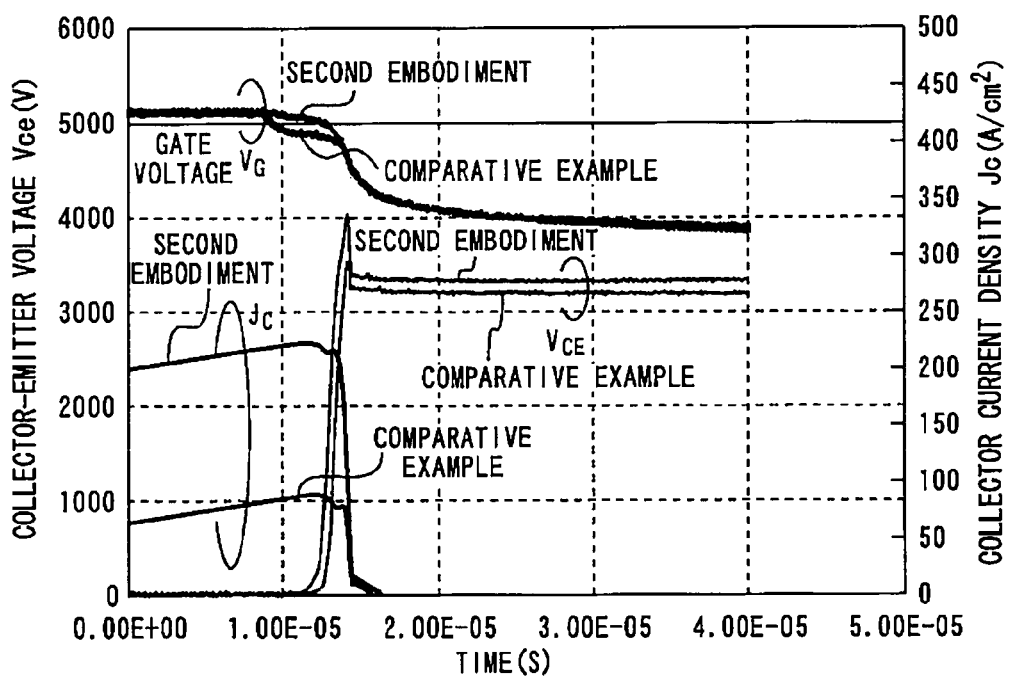
FIG. 14 is a graph showing the turn-off waveforms of IGBT of the second embodiment and the comparative example simulated using the circuit shown in FIG. 13.

FIG. 14 is a graph showing the turn-off waveforms of IGBT of the second embodiment and the comparative example simulated using the circuit shown in FIG. 13. As seen from the graph, the current breaking capability of the second embodiment is 2.5 times the current breaking capability of the comparative example.

In the second embodiment, the P-type collector layer 17 is omitted from the termination region, and the N-type buffer layer 19 is made to directly contact with the collector electrode 18. Thereby, since carrier generation in the collector structure of the termination region during the turn-off operation is decreased, the depletion from the P-type layer 11 to the collector side is accelerated, and the field intensity is lowered. As a result, the current breaking capability during the turn-off operation of the IGBT can be improved.

In addition, when "the width of the region where lattice defect is introduced" in the abscissa is replaced to "the width of the region where no P-type collector layer is present", the same result can be obtained also in the second embodiment. Therefore, in the second embodiment, the ON voltage (ON resistance) can be lowered.

Third Embodiment

Figure 15:
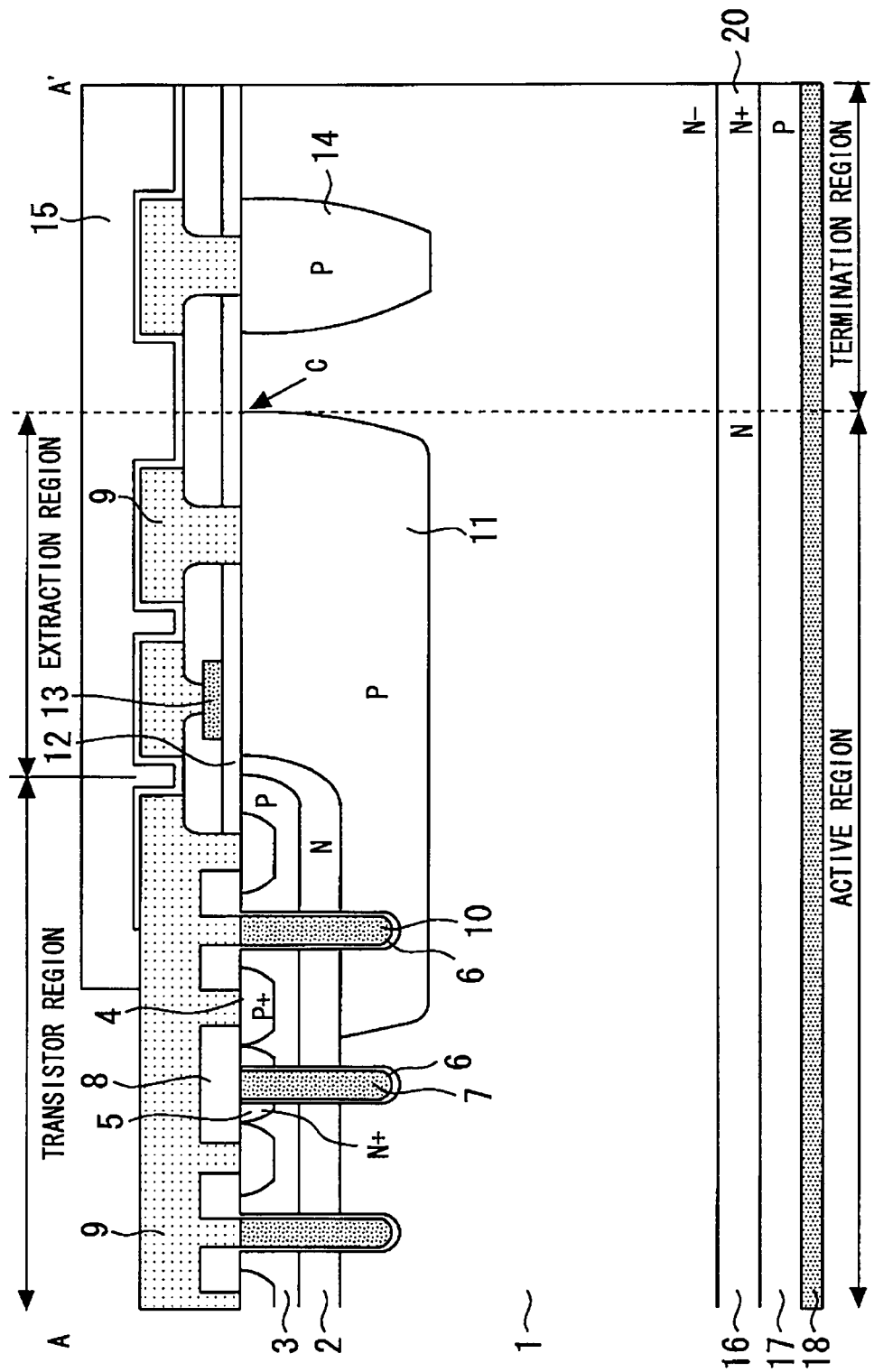
FIG. 15 is a sectional view showing a semiconductor device according to the third embodiment of the present invention.

FIG. 15 is a sectional view showing a semiconductor device according to the third embodiment of the present invention. In the transistor region and the extraction region, an N-type buffer layer 16 is formed under the N⁻-type drift layer 1. In the termination region, an N⁺-type buffer layer 20 is formed under the N⁻-type drift layer 1. A P-type collector layer 17 is formed under the N-type buffer layer 16 and the N⁺-type buffer layer 20. A collector electrode 18 is connected to the P-type collector layer 17. The impurity concentration of the N⁺-type buffer layer 20 is higher than the impurity concentration of the N-type buffer layer 16.

In the third embodiment, an N⁺-type buffer layer 20 having a high impurity concentration is formed in the termination region. Thereby, since hole implantation from the P-type collector layer 17 is suppressed in the termination region during the turn-off operation of the IGBT, depletion from the P-type layer 11 to the collector side is accelerated, and the field intensity is lowered. As a result, the current breaking capability during the turn-off operation of the IGBT can be improved.

In addition, when "the width of the region where lattice defect is introduced" in the abscissa is replaced to "the width of the region where the second N-type buffer layer is present", the same result can be obtained also in the third embodiment. Therefore, in the third embodiment, the ON voltage (ON resistance) can be lowered.

Although semiconductor devices having a high withstand voltage of 4500 V were described in first to third embodiments, the above-described effects despite withstand voltage can be obtained. Although the case wherein the IGBT in the transistor region has a trench gate structure was described in the first to third embodiments, the above-described effect can also be obtained from the case of a plane gate structure. In addition, although the case wherein a guard ring composed of a P-type layer 14 is formed in the termination region was described, the above-described effect can also be obtained from the other structure maintaining withstand voltage.

Furthermore, not only the semiconductor devices formed of silicon, but also those formed of a wide-band gap semiconductor according to the first to third embodiments can obtain effects described in the present embodiment. Wide-band gap semiconductor materials include, for example, silicon carbide, gallium nitride or diamond. Since semiconductor devices formed of wide-band gap semiconductor have high withstand voltage or high allowable current density, these devices can be miniaturized. By using these miniaturized semiconductor devices, the semiconductor module having such elements can also be miniaturized. Also since the heat resistance of the semiconductor device is high, the heat dissipating fins of a heat sink can further be miniaturized, and since water cooling can be replaced to air cooling, the semiconductor modules can be further miniaturized. In addition, since the power loss of the semiconductor device is low and highly efficient, the semiconductor module can be made highly efficient.

Obviously many modifications and variations of the present invention are possible in the light of the above teachings. It is therefore to be understood that within the scope of the appended claims the invention may be practiced otherwise than as specifically described.

The entire disclosure of a Japanese Patent Application No. 2011-098360, filed on Apr. 26, 2011 including specification, claims, drawings and summary, on which the Convention priority of the present application is based, are incorporated herein by reference in its entirety.

What is claimed is:

1. A semiconductor device comprising:
   a transistor region including an IGBT having a gate electrode and an emitter electrode;
   a termination region placed around the transistor region; and
   an extraction region placed between the transistor and the termination region and extracting redundant carriers,
   wherein a P-type layer is placed on an N-type drift layer in the extraction region,
   the P-type layer is connected to the emitter electrode,
   a dummy gate electrode is placed via an insulation film on the P-type layer,
   the dummy gate electrode is connected to the gate electrode,
   life time of carriers in the termination region is shorter than life time of carriers in the transistor region and the extraction region.

2. The semiconductor device according to claim 1, wherein density of lattice defect in the termination region is higher than density of lattice defect in the transistor region and the extraction region.

3. A semiconductor device comprising:
   a transistor region including an IGBT having a gate electrode and an emitter electrode;
   a termination region placed around the transistor region; and
   an extraction region placed between the transistor and the termination region and extracting redundant carriers,
   wherein a P-type layer is placed on an N-type drift layer in the extraction region,
   the P-type layer is connected to the emitter electrode,
   a dummy gate electrode is placed via an insulation film on the P-type layer,
   the dummy gate electrode is connected to the gate electrode,
   a first N-type buffer layer is placed under the N-type drift layer in the transistor region and the extraction region,
   a P-type collector layer is placed under the first N-type buffer layer,
   a second N-type buffer layer is placed under the N-type drift layer in the termination region, and
   a collector electrode is directly connected to the P-type collector layer and the second N-type buffer layer.

* * * * *